US009123265B2

(12) United States Patent
Matsumoto et al.

(10) Patent No.: US 9,123,265 B2
(45) Date of Patent: Sep. 1, 2015

(54) PLANER LIGHT SOURCE DEVICE WITH FIXING PORTION AND DISPLAY DEVICE USING THE SAME

(75) Inventors: Shigeyuki Matsumoto, Tokyo (JP); Kenji Arita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 341 days.

(21) Appl. No.: 13/557,008

(22) Filed: Jul. 24, 2012

(65) Prior Publication Data

US 2013/0033897 A1  Feb. 7, 2013

(30) Foreign Application Priority Data

Aug. 3, 2011  (JP) ................................ 2011-170247

(51) Int. Cl.
*G09F 13/04* (2006.01)
*F21V 23/00* (2015.01)
*F21V 19/00* (2006.01)
*H05K 1/14* (2006.01)

(52) U.S. Cl.
CPC .............. *G09F 13/04* (2013.01); *F21V 19/003* (2013.01); *F21V 23/004* (2013.01); *H05K 1/147* (2013.01)

(58) Field of Classification Search
CPC ... F21V 19/003; F21V 19/045; F21V 23/004; H05K 1/147
USPC .......... 362/612–613, 631–634, 646, 362/217.1–217.13; 349/58
See application file for complete search history.

(56) References Cited

U.S. PATENT DOCUMENTS

| | | | | |
|---|---|---|---|---|
| 6,771,332 B2* | 8/2004 | Yamada | ........................... | 349/62 |
| 8,039,753 B2* | 10/2011 | Jang et al. | ...................... | 174/254 |
| 8,134,676 B2* | 3/2012 | Shim | .............................. | 349/150 |
| 8,284,349 B2* | 10/2012 | Kim et al. | ........................ | 349/65 |
| 8,360,591 B2* | 1/2013 | Jung | ............................. | 362/97.1 |
| 2008/0174731 A1 | 7/2008 | Kang et al. | | |
| 2008/0192505 A1* | 8/2008 | Park | ............................. | 362/615 |
| 2013/0033897 A1* | 2/2013 | Matsumoto et al. | .......... | 362/611 |

FOREIGN PATENT DOCUMENTS

| | | |
|---|---|---|
| JP | 2005-267881 A | 9/2005 |
| JP | 2007-078929 A | 3/2007 |
| JP | 2008-091275 A | 4/2008 |
| JP | 2008-176266 A | 7/2008 |
| JP | 2009-158260 A | 7/2008 |

* cited by examiner

OTHER PUBLICATIONS

An Office Action; "Notification of Reasons for Refusal," issued by the Japanese Patent Office on Mar. 31, 2015, which corresponds to Japanese Patent Application No. 2011-170247 and is related to U.S. Appl. No. 13/557,008; with English language translation.

*Primary Examiner* — Robert May
(74) *Attorney, Agent, or Firm* — Studebaker & Brackett PC (57) ABSTRACT

A planar light source device includes: a point light source that emits light; a circuit board that has a mounting portion, on which the point light source mounted, and a fixing portion, on which a connector supplying electric power to the point light source is mounted; and a frame that holds the circuit board with the point light source, wherein the circuit board has a protruding portion that protrudes from an end portion of the fixing portion, and wherein the fixing portion of the circuit board is fixed at an inner portion of the frame, and wherein the protruding portion of the circuit board is fixed at an outer portion of the frame, which is opposite to the inner portion of the fixing portion.

7 Claims, 11 Drawing Sheets

PLANER LIGHT SOURCE DEVICE WITH FIXING PORTION AND DISPLAY DEVICE USING THE SAME

CROSS-REFERENCE TO RELATED APPLICATION

This application claims priority from Japanese Patent Application No. 2011-170247 filed on Aug. 3, 2011, the entire subject matter of which is incorporated herein by reference.

TECHNICAL FIELD

This disclosure relates to a planar light source device using point light sources, and more particularly, to a display device using a liquid crystal panel and a planar light display device for the display device.

BACKGROUND

Generally, liquid crystal displays, advertising displays, guide signs, and the like are not self-luminous display devices having display units that emit light by their selves. Therefore, it is necessary to provide planar light source devices such as backlights at the rear faces of the display units. The planar light source devices are a side light type (also referred to as an edge light type) and a direct back light type, for example. In the side light type of planar light source devices, light sources are disposed on side portions of cases, and in the direct back light type of planar light source devices, light sources are disposed on the rear face sides of cases to face the liquid crystal display unit.

The side-light-type planar light source devices may use light guide plates for guiding light from light sources in desired directions. The planar light source devices using the light guide plates may use line light sources such as cold cathode fluorescent lamps, or a circuit board such as a Flexible Printed Circuit board (hereinafter, referred to as FPC) having point light sources such as light emitting diodes arranged in line thereon. The FPC includes wiring patterns for supplying electric power to each of the point light sources such as LEDs, and has connectors at their end portions. The connectors are connected to other connectors of drivers or the like for supplying electric power to the FPC, and electric power is supplied to each of the point light sources through the wiring patterns. Incidentally, if an FPC shifts, a defect may occur in the connection between the connector of the FPC and a corresponding connector.

For this reason, JP-A-2007-78929 discloses an electro-optical device having a structure for position connectors by an extending portion of a FPC and an positioning reference portion provided at a portion of a case. Therefore, a defect in the connection between the connectors is suppressed.

Also, JP-A-2005-267881 discloses a planar light source device having a structure for inserting a second FPC having light sources mounted thereon into a notched portion of a frame. Therefore, the second FPC is locked at an appropriate position.

SUMMARY

According to the structures disclosed in JP-A-2007-78929 and JP-A-2005-267881, it may be possible to dispose the FPC at accurate positions. However, when the connector is connected or disconnected, an applied external force may cause a shift of the position of the FPC in the vicinities of the connector. In the planar light source device, in case that the position of the FPC in the vicinity of the connector shifts and the connectors cannot be connected in an accurate state (oblique state), a defect occurs in the connection between the terminals of the connectors. Further, electric power may be not supplied to the point light sources, and then the point light sources are not turned on, or electric power may be not stably supplied to the point light sources, so that an electric discharge to damage to the connectors may be caused.

Further, when the position of the FPC in the vicinity of the connector shifts, the position of the FPC corresponding to a point-light-source mounting portion also shifts. Therefore, in a planar light source device using a light guide plate, it may become difficult that light of point light sources enters the light guide plate, and the quality of display may be reduced due to a decrease in brightness, non-uniformity in brightness, and so on.

Meanwhile, in order to suppress a shift of the position of the connector, it may be considered to fix the FPC by using a general double-stick tape. However, when a connector of another electronic component is inserted into or pulled out from the connector of the FPC, an external force may applied to the double-stick tape in the connector insertion or pulling direction (shearing direction), and then the FPC may shift in the adhesive interface of the double-stick tape. Also, if a double-stick tape having a strong adhesive strength is selected, other problems such as an increase in the cost or thickness may occur.

In view of the above, this disclosure provides at least a planar light source device to suppress the position of an FPC of the planar light source device from shifting in the vicinity of a connector formed at the FPC due to an external force applied when another connector is inserted into or pulled out from the connector of the FPC.

A planar light source device of this disclosure comprises: a point light source that emits light; a circuit board that has a mounting portion, on which the point light source mounted, and a fixing portion, on which a connector supplying electric power to the point light source is mounted; and a frame that holds the circuit board with the point light source, wherein the circuit board has a protruding portion that protrudes from an end portion of the fixing portion, and wherein the fixing portion of the circuit board is fixed at an inner portion of the frame, and wherein the protruding portion of the circuit board is fixed at an outer portion of the frame, which is opposite to the inner portion of the fixing portion.

According to the configuration of this disclosure, it is possible to suppress the position of the circuit board (FPC) of the planar light source device from shifting in the vicinity of a connector formed at the circuit board due to an external force applied when another connector is inserted into or pulled out from the connector of the circuit board, and thus it is possible to achieve a reliable planar light source device and display device.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

A configuration of a display device according to this disclosure will be described with reference to the accompanying drawings. In the drawings, the same reference symbol represents the similar components.

Figure 1:
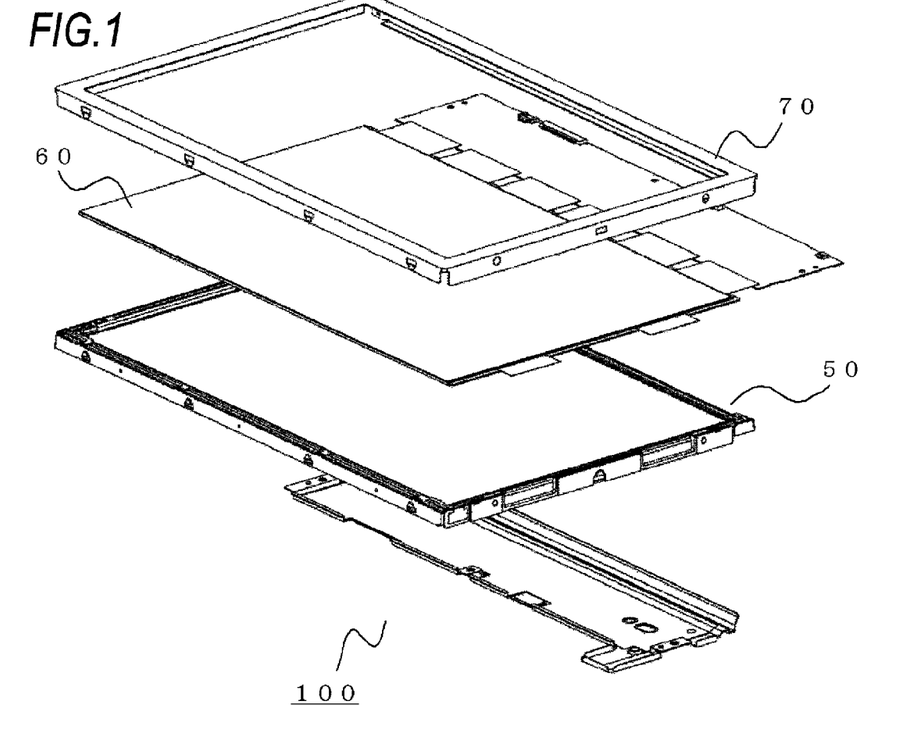
FIG. 1 is an exploded perspective view illustrating a display device according to this disclosure.
Figure 2:
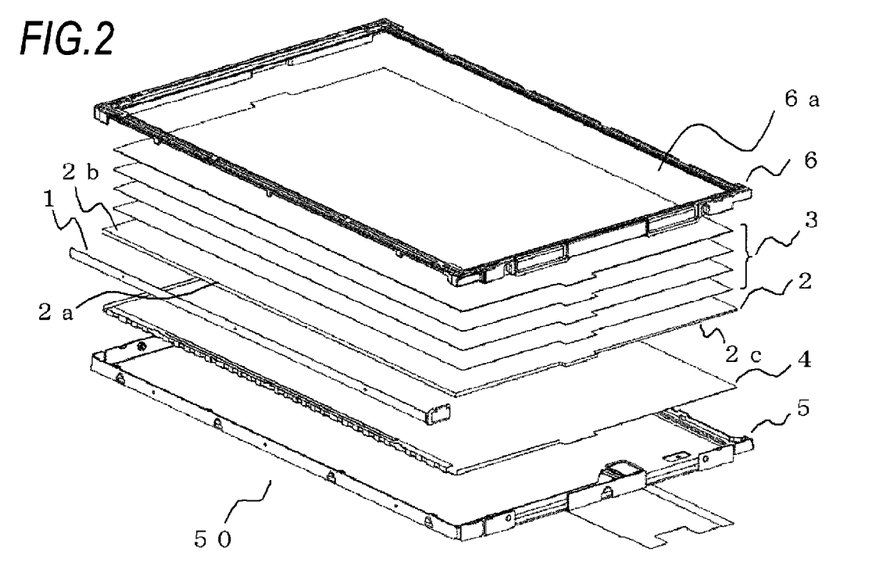
FIG. 2 is an exploded perspective view illustrating a planar light source device according to this disclosure.
Figure 3:
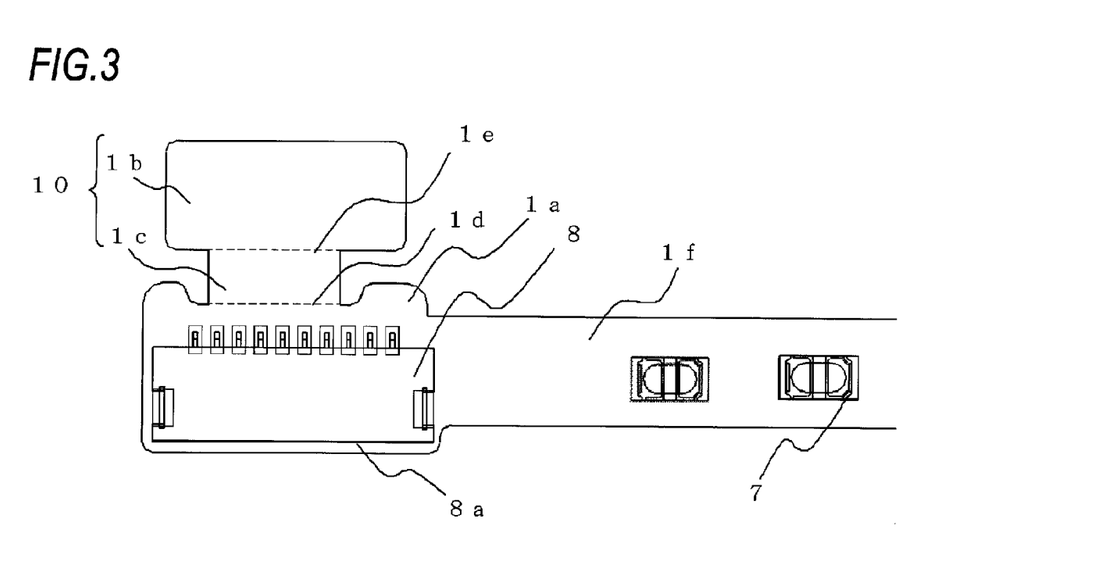
FIG. 3 is an enlarged perspective view illustrating a part of an FPC for a planar light source device according to a first illustrative embodiment.
Figure 4A:
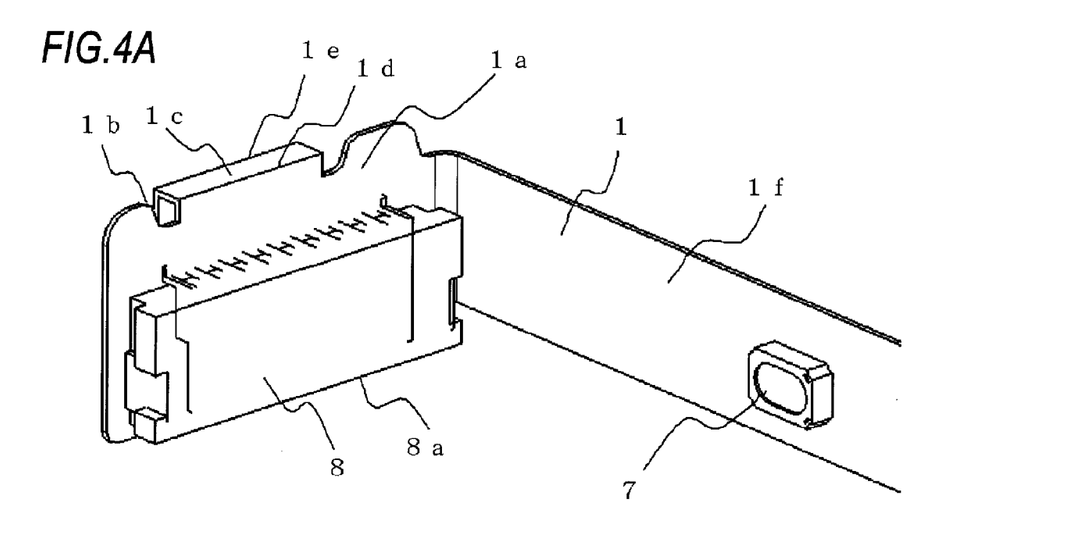
FIGS. 4A and 4B are enlarged perspective views illustrating a part of the FPC for a planar light source device according to the first illustrative embodiment.
Figure 4B:
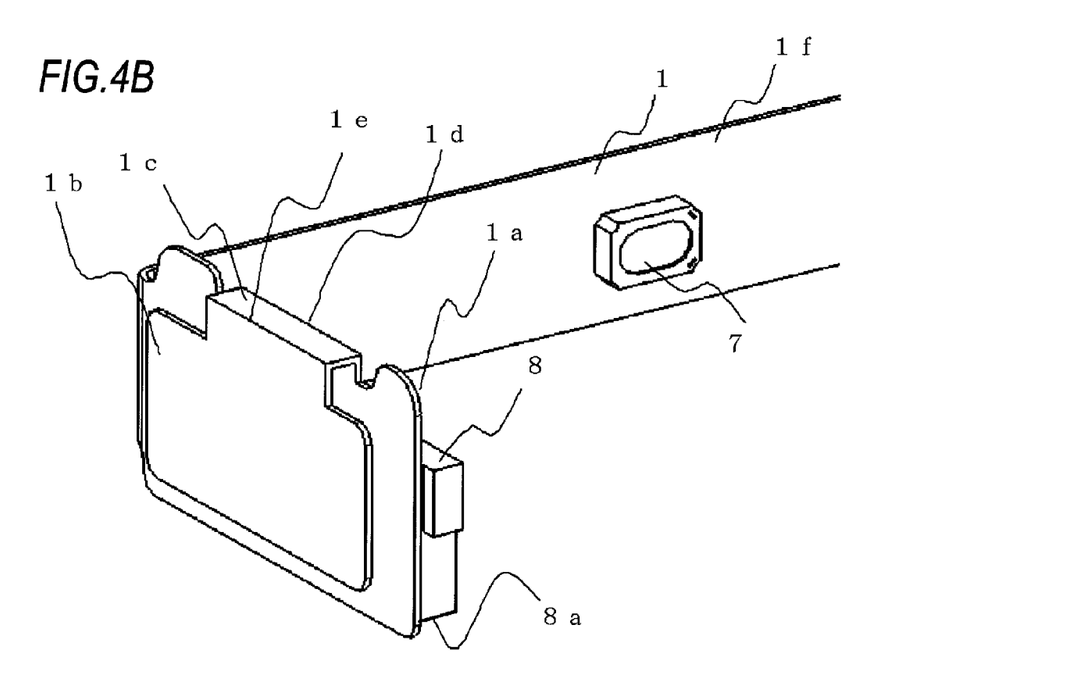
Figure 5:
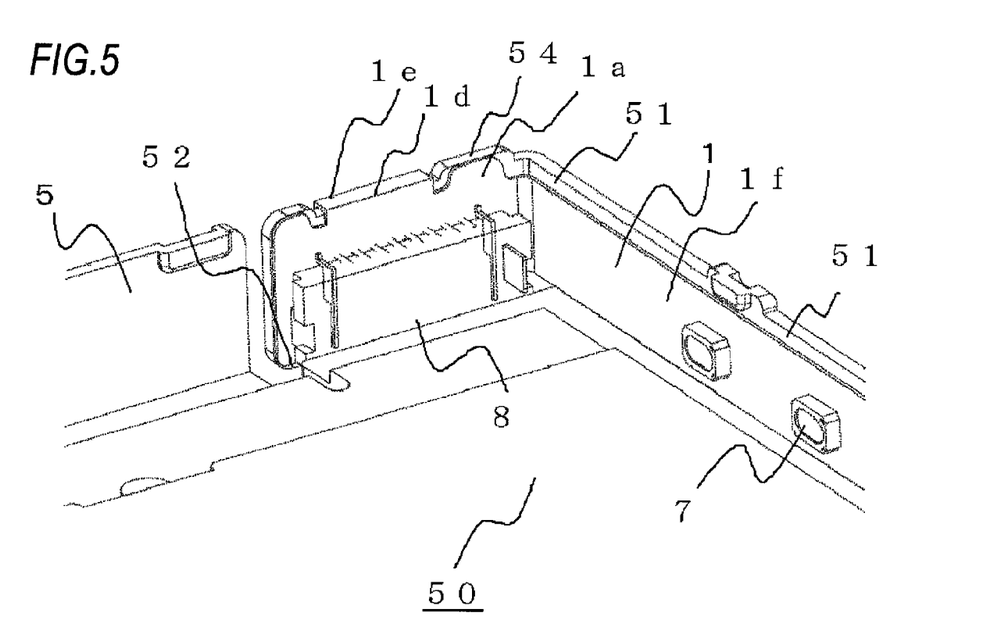
FIG. 5 is an enlarged view illustrating a planar light source device according to the first illustrative embodiment.
Figure 6:
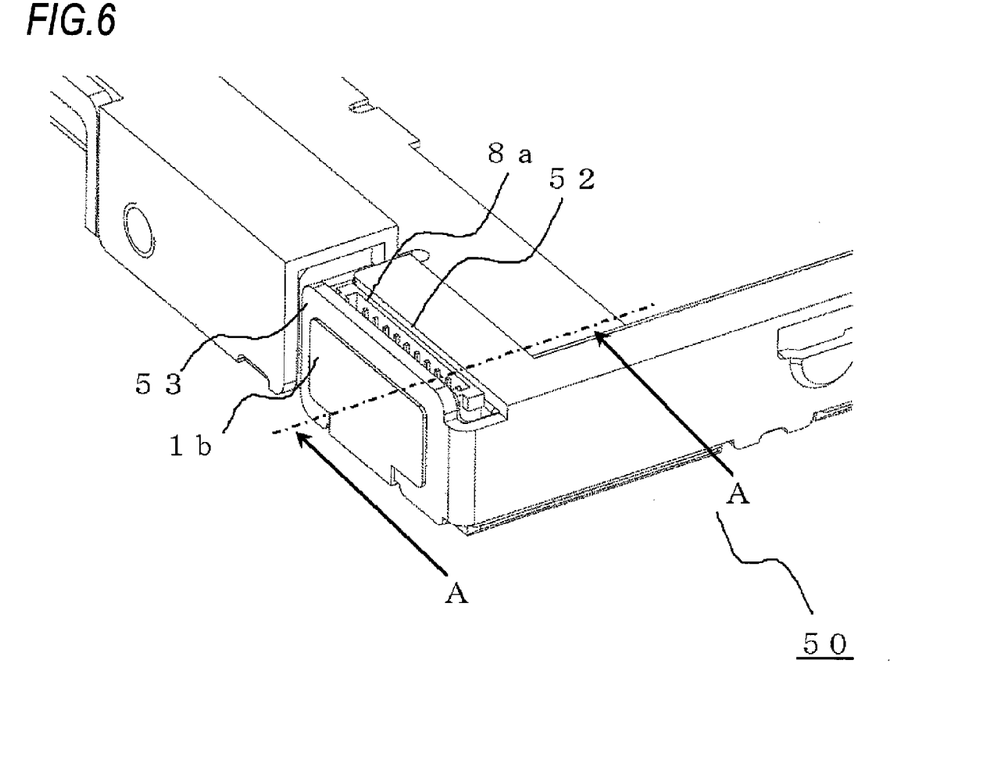
FIG. 6 is an enlarged view illustrating a part of the planar light source device according to the first illustrative embodiment as viewed from its rear face.
Figure 7:
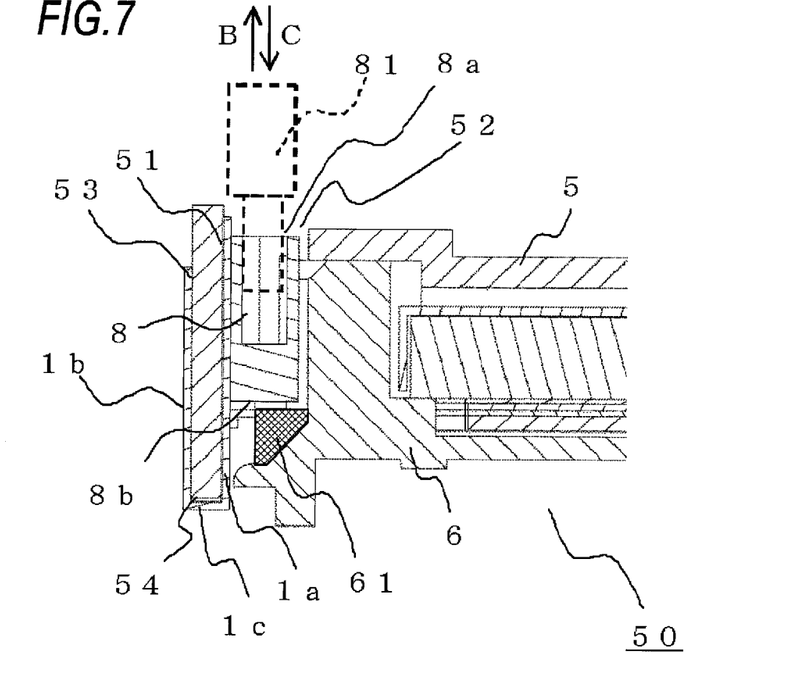
FIG. 7 is a cross-sectional view illustrating the planar light source device of FIG. 6 taken along a line A-A.

FIG. 1 is an exploded perspective view illustrating a configuration of a display device using a planar light source device according to this disclosure, FIG. 2 is an exploded perspective view illustrating a configuration of a planar light source device, and FIG. 3 is an enlarged perspective view illustrating a part of an FPC which is disposed in a planar light source device. FIGS. 4A and 4B are enlarged perspective views illustrating a part of an FPC, which is disposed in a planar light source device. More specifically, FIG. 4A is an enlarged view as viewed from a face having a connector mounted thereon, and FIG. 4B is an enlarged view as viewed from the opposite face of the connector mounting face. FIG. 5 is an enlarged view illustrating a part of a planar light source device, FIG. 6 is an enlarged view illustrating a part of the planar light source device as viewed from its rear face, and FIG. 7 is a cross-sectional view illustrating the planar light source device of FIG. 6 taken along a line A-A.

First Illustrative Embodiment

Display Device

As shown in FIG. 1, a display device 100 of this disclosure includes a display element 60 disposed on a planar light source device 50, which irradiates the display element 60 with light from the rear face. The display element 60 and the planar light source device 50 are joined by an upper frame 70, so that the display device 100 is configured.

<Planar Light Source Device>

Next, the planar light source device 50 will be described with reference to FIG. 2. The planar light source device 50 includes an FPC 1 having a plurality of light sources for emitting light, and the planar light source device 50 is disposed to face an incident face 2a which is a side face of a light guide plate 2. Light enters the incident face 2a, propagates in the light guide plate 2, and exits from an exit face 2b. Optical sheets 3 are provided on the exit face 2b of the light guide plate 2, and a reflective sheet 4 is provided on the opposite face 2c of the exit face of the light guide plate 2 to. Also, the FPC 1 having the light sources mounted thereon, the light guide plate 2, the optical sheets 3, and the reflective sheet 4 are accommodated in a lower frame 5, and are sandwiched between the lower frame 5 and an intermediate frame 6, whereby the planar light source device 50 is configured. The intermediate frame 6 has an opening 6a formed at a position corresponding to the exit face 2b of the light guide plate 2, and planar light exits from the opening 6a. The size of the opening 6a is set so that the opening 6a is positioned in the inner side more than the outer circumference of the light guide plate 2.

<FPC>

As shown in FIGS. 3 to 5, the FPC 1 used in the first illustrative embodiment is made of a flexible film or the like, and the FPC 1 includes a mounting portion if having a plurality of point light sources 7 such as LEDs mounted thereon, so that the point light sources 7 are aligned almost in line. Also, the FPC 1 includes a wiring pattern formed on a mounting face of the mounting portion 1f, which supplies electric power to the point light sources 7, and a fixing portion 1a provided at its end portion, on which a connector 8 to be fixed by soldering. In the first illustrative embodiment, the mounting face of the mounting portion 1f, the wiring-pattern forming face, and the face of the fixing portion 1a for fixing the connector 8 are formed at the same face.

Further, as shown in FIG. 3, at the FPC 1, a protruding portion 10 is configured by a first protruding portion 1b and a second protruding portion 1c protruding from an end portion of the fixing portion 1a. The protruding portion 10 (the first protruding portion 1b and the second protruding portion 1c) protrudes from an opposite side 1d of the fixing portion 1a, which is opposite to one side close to a insertion hole 8a of the connector 8 to connect with another connector, toward the opposite to the insertion hole 8a. In addition, as shown in FIGS. 4A and 4B, a bent portion 1d is provided between the fixing portion 1a and the second protruding portion 1c, and a bent portion 1e is provided between the second protruding portion 1c and the first protruding portion 1b. Therefore, the first protruding portion 1b faces the fixing portion 1a via the second protruding portion 1c.

Next, a configuration in which the FPC 1 is disposed in the planar light source device 50 will be described with reference to FIGS. 5 to 7. As shown in FIG. 5, the FPC 1 is disposed at the lower frame 5, and is fixed thereto by a double-stick tape (not shown). Also, the mounting portion if of the FPC 1 having the point light sources 7 disposed thereon is disposed along an inner portion 51 so that the point light sources 7 face the incident face 2a of the light guide plate 2 shown in FIG. 2. Further, the connector fixing portion 1a for the connector 8 is also disposed at an inner portion 51 of the lower frame 5. As shown in FIG. 5, the FPC 1 is bent so that the mounting portion 1f and the connector fixing portion 1a are provided over the adjacent inner portions 51 of the lower frame 5. However, the FPC 1 may be provided along one inner portion 51 without being bent. The FPC 1 may be provided on the bottom of the lower frame 5.

The bottom of the lower frame 5 has a hole 52 formed at a position at the insertion hole 8a of the connector 8. This hole 52 is disposed corresponding to the insertion hole 8a of the connector 8, and the fixing portion 1a is fixed to a inner portion 51. Also, the first protruding portion 1b protruding from the fixing portion 1a toward the opposite of the insertion hole 8a of the connector 8 is bent by the bent portions 1d and 1e, and then the first protruding portion 1b is disposed to face the outer portion 53 of the lower frame 5, which is opposite to the inner portion 51, and is fixed to the outer portion 53. Further, the second protruding portion 1c is disposed at a connecting portion 54 of the lower frame 5 for connecting between the inner portion 51 and the outer portion 53. According to this configuration, in the vicinity of the connector fixing portion 1a of the FPC 1, the FPC 1 is wound around the side portion of the lower frame 5. That is, the side portion of the lower frame 5 is surrounded by the fixing portion 1a, the first protruding portion 1b, and the second protruding portion 1c, and then is fixed to the side portion of the lower frame 5 by the double-stick tape.

Also, as shown in FIG. 7, the intermediate frame 6 configuring the planar light source device 50 has a protruding portion 61 formed at a position to face with a face 8b of the connector 8, which is disposed to opposite to the insertion hole 8a. According to this configuration, when the planar light source device 50 is configured, the face 8b of the connector 8 is disposed to face the protruding portion 61 of the upper frame.

The effect of the planar light source device of the first illustrative embodiment will be described.

In FIG. 7, the fixing portion 1a of the FPC 1 is fixed to the inner portion 51 of the lower frame 5 by facial adhesion using the double-stick tape, so that the rear face of the fixing portion 1a and the inner portion 51 are fixed in a vertical direction. In case that a connector 81 of another electronic component is pulled out in the connection state, in which the connector 81 connects the connector 8 fixed to the fixing portion 1a of the FPC 1, the connector 8 receives a strong force B in the pulling direction of the connector 81 (in other words, in the opposite direction to the insertion direction of the connector 8). The force B is transmitted from the connector 8 to the fixing portion 1a of the FPC 1. However, since the first protruding portion 1b protruding from the end portion of the fixing portion 1a of the FPC 1 is fixed to the outer portion 53, which is the opposite face of the inner portion 51 of the lower frame 5, via the second protruding portion 1c, it is possible to sufficiently ensure the adhesion area with the lower frame 5 in the vicinity of the fixing portion 1a of the connector 8. Therefore, it is possible to suppress the FPC 1 in the vicinity of the connector 8 from peeling off the lower frame 5 and shifting.

Due to the force B, a force (shearing force) is applied to the connector fixing portion 1a, mainly in a direction parallel with the inner portion 51, that is, a direction in which the adhesive face of the double-stick tape used for fixing the fixing portion 1a to the inner portion 51 of the lower frame 5 shifts. Also, if the force is transmitted to the second protruding portion 1c adjacent to the fixing portion 1a, a force (compressive stress) is applied to the connecting portion 54 of the lower frame 5 in a vertical direction. Further, since the first protruding portion 1b is fixed to the outer portion 53, which is the opposite face of the inner portion 51, by face adhesion, it is possible to suppress a force (shearing force) in a direction in which the fixing portion 1a and the inner portion 51 of the lower frame 5 shift with respect to each other.

If a force C is applied in a direction in which the connector 81 of another electronic component is inserted into the connector 8 fixed to the FPC 1, since the FPC 1 is fixed to the inner portion 51 of the lower frame 5 by adhesion using the double-stick tape, a shift of the connector 8 is suppressed. Also, in this disclosure, since the face 8b of the connector 8, which is disposed to opposite to the insertion hole 8a, is disposed to face the protruding portion 61 of the intermediate frame 6, the intermediate frame 6 receives a force by the protruding portion 61 via the face 8b. Therefore, it is possible to suppress a shift of the connector 8 and a shift of the FPC 1.

As described above, according to the planar light source device of the first illustrative embodiment, the protruding portion 10 configured by the second protruding portion 1c and the first protruding portion 1b is formed from the end portion of the connector fixing portion 1a of the FPC 1, is disposed on the inner portions 51, the connecting portion 54, and the outer portion 53 of the lower frame 5 so that the FPC 1 surrounds the side portion of the lower frame 5, and then the protruding portion 10 is fixed to the lower frame 5. In this way, the adhesion area is ensured, so that a shearing stress applied on the fixing portion 1a due to the force B applied in the direction in which the connector 81 is pulled out from the connector 8 is distributed. Therefore, it is possible to suppress the fixing portion 1a of the FPC 1 from shifting from the lower frame 5. Also, since the first protruding portion 1b is fixed to the outer portion 53, which is the opposite face of the inner portion 51, so as to suppress the force applied to the fixing portion 1a, it is possible to suppress the fixing portion 1a of the FPC 1 from shifting from the lower frame 5.

Accordingly, in the planar light source device 50, it is possible to suppress a shift of the position the FPC 1 (the fixing portion 1a) in the vicinity of the connector 8. Therefore, the connector 81 of another electronic component can be connected to the connector 8 in an accurate state (for example, an oblique state), electric power can be supplied to the point light sources 7, or damage to the connectors can be suppressed. As a result, it is possible to configure a reliable planar light source device 50.

Also, since the face 8b of the connector 8, which is disposed to opposite to the insertion hole 8a, is supported to the protruding portion 61 of the intermediate frame 6, it is possible to suppress the connector 8 from shifting due to the force C applied in the insertion direction of the connector 81 of another electronic component.

Further, since it is possible to suppress a shift of the position of the FPC 1 (the fixing portion 1a) in the vicinity of the connector 8, it is possible to suppress the connector 8 from moving away from the connector 81 when connecting between the connectors 8 and 81. Therefore, it is possible to more reliably connect the connectors.

Figure 8:
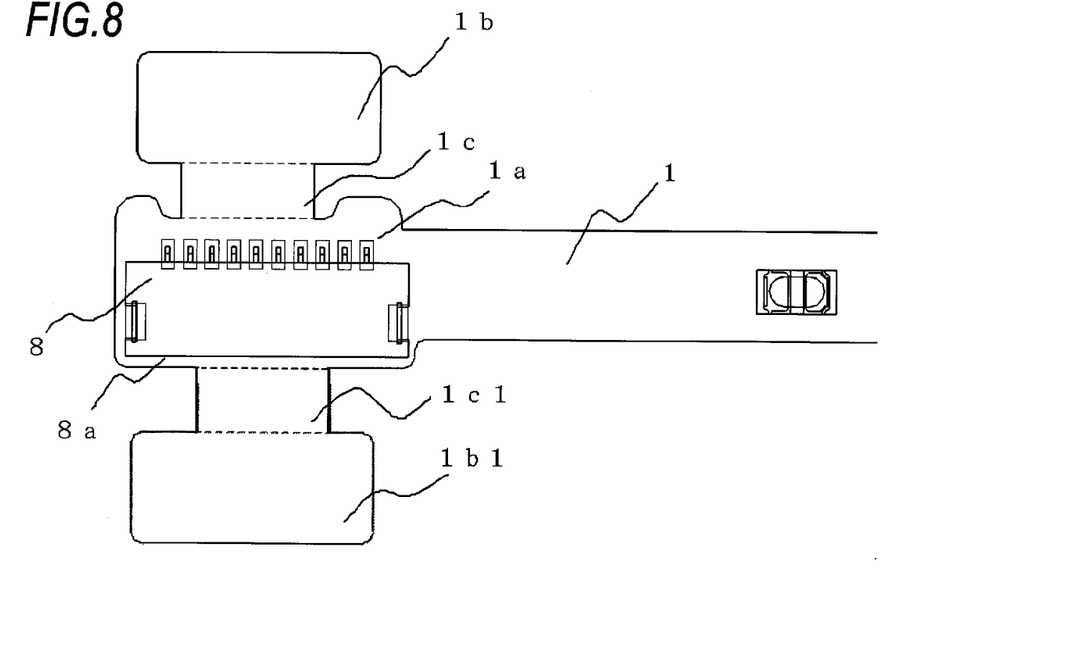
FIG. 8 is an enlarged view illustrating a part of an FPC according to a modification of the first illustrative embodiment.
Figure 9:
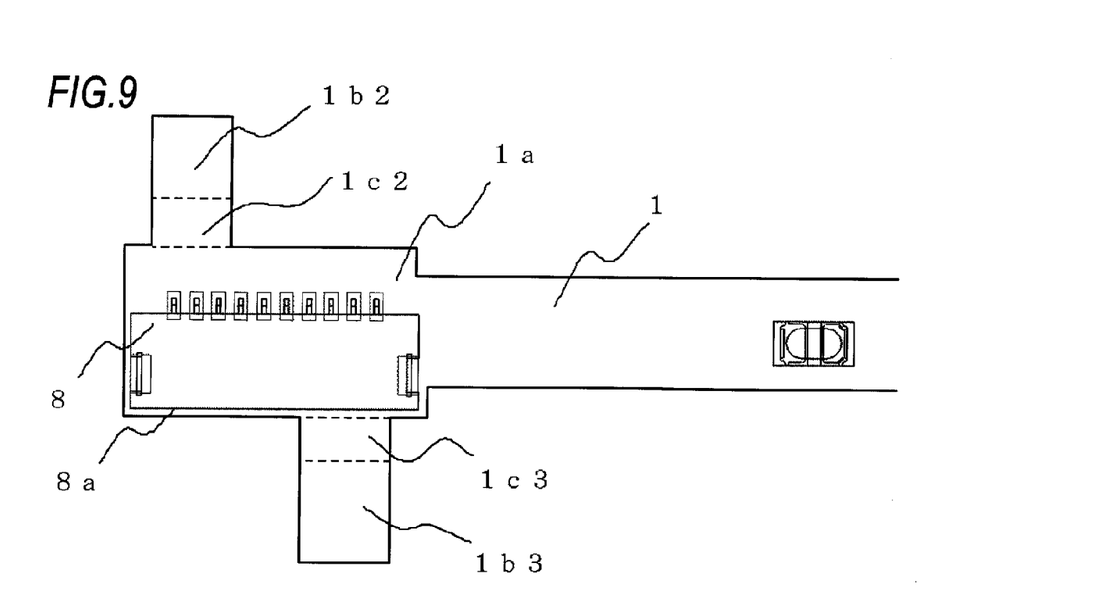
FIG. 9 is an enlarged view illustrating a part of an FPC according to another modification of the first illustrative embodiment.

FIGS. 8 and 9 are enlarged views illustrating a part of FPC 1 according to modifications of the first illustrative embodiment. In the first illustrative embodiment, the first protruding portion 1b and the second protruding portion 1c provided in the vicinity of the connector fixing portion 1a of the FPC 1 protrude from the opposite side 1d of the fixing portion 1a, which is opposite to one side close to the insertion hole 8a of the connector 8, toward the opposite of the insertion hole 8a. However, as shown in FIG. 8, another protruding portion may also be provided on the opposite side to the first protruding portion 1b and the second protruding portion 1c at the fixing portion 1a of the connector 8. A third protruding portion 1b1 may be formed at one side close to the insertion hole 8a of the connector 8 via a fourth protruding portion 1c1 to wound around a side portion of the lower frame 5 so as to surround the side portion of the lower frame 5, and is fixed to the side portion of the lower frame 5. According to this configuration, even if a force is applied to the connector 8 of the FPC 1 in the insertion direction C or the pulling direction B of the connector 81 of another electronic component in FIG. 7, it is possible to suppress a shift of the position the FPC 1 in the vicinity of the connector 8. Also, as shown in FIG. 9, the first protruding portion 1b and the second protruding portion 1c provided at the opposite side 1d of one side close to the insertion hole 8a of the connector 8, and a third protruding portion 1b3 and a fourth protruding portion 1c3 provided at the one side close to the insertion hole 8a of the connector 8 may protrude from asymmetrical positions to not correspond to each other, in opposite directions. According to this configuration, the first and second protruding portions 1b2 and 1c2 and the third and fourth protruding portions 1b3 and 1c3 provided at the connector fixing portion 1a of the FPC 1 are disposed to surround the side portion of the lower frame 5 without overlapping each other. Therefore, it is possible to ensure an adhesive strength.

Second Illustrative Embodiment

Figure 10A:
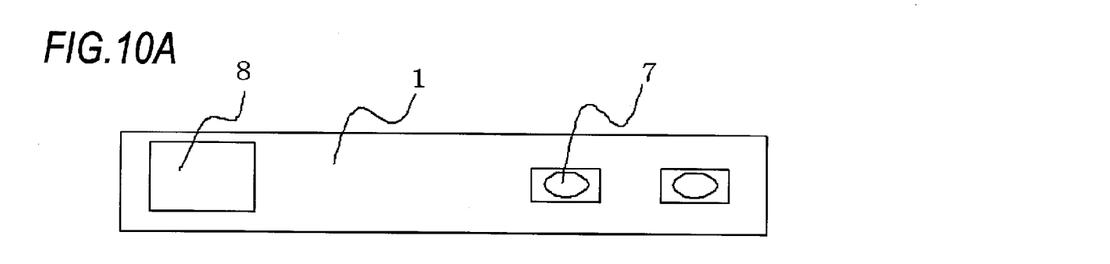
FIGS. 10A to 10C are enlarged views illustrating a part of an FPC for a planar light source device according to a second illustrative embodiment.
Figure 10B:
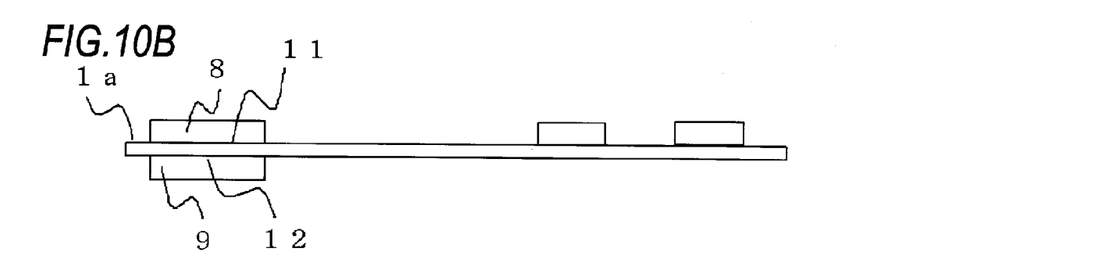
Figure 10C:
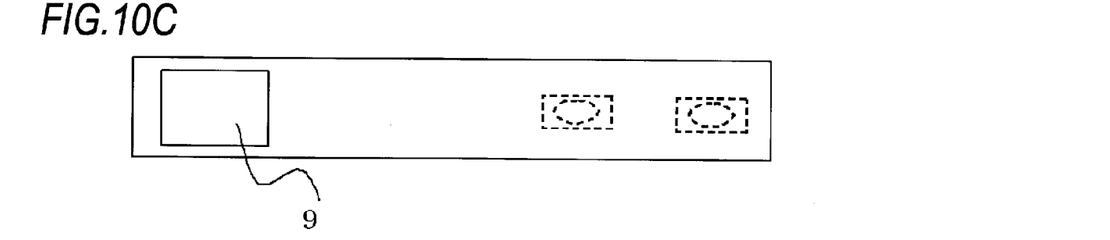
Figure 11:
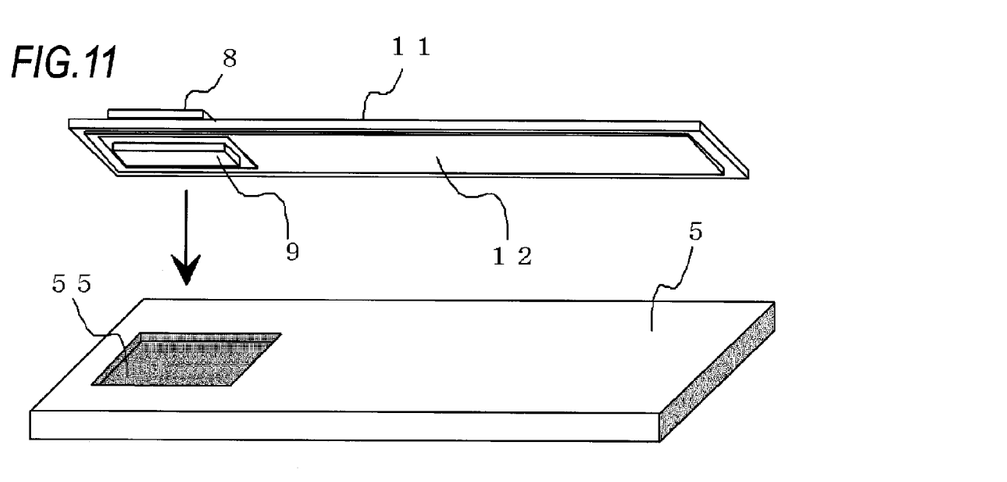
FIG. 11 is an enlarged view illustrating a part of a planar light source device according to the second illustrative embodiment.
Figure 12:
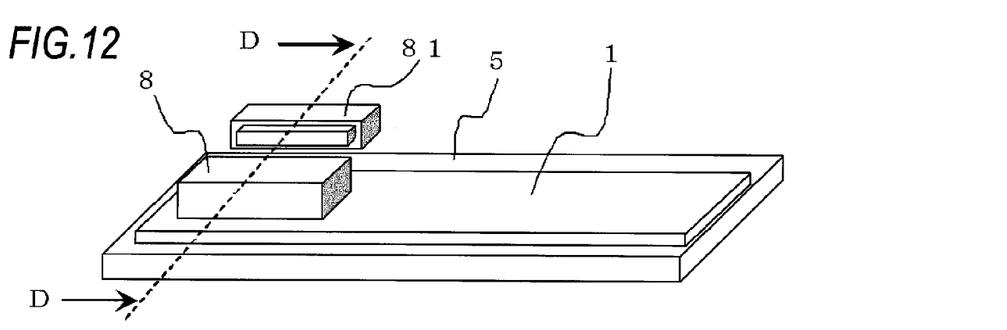
FIG. 12 is another enlarged view illustrating the part of the planar light source device according to the second illustrative embodiment.
Figure 13:
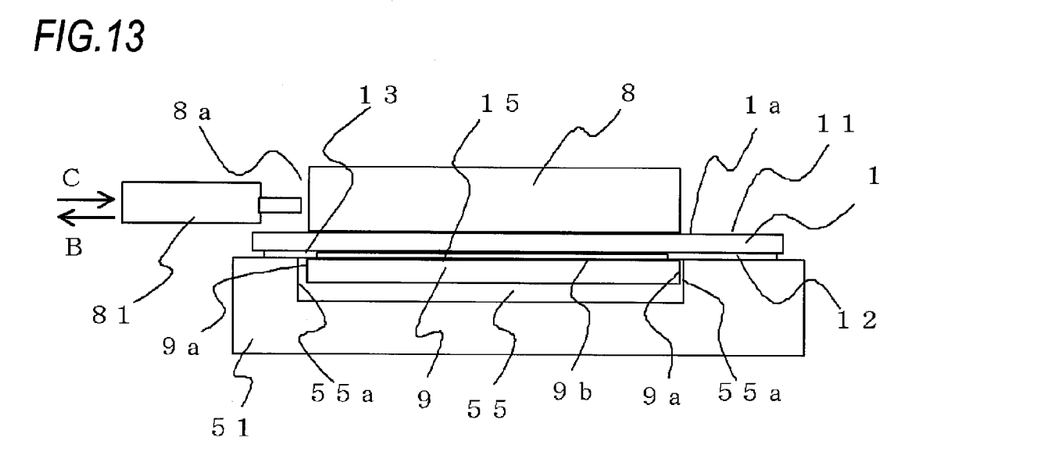
FIG. 13 is a cross-sectional view illustrating the planar light source device of FIG. 12 taken along a line D-D.
Figure 14:
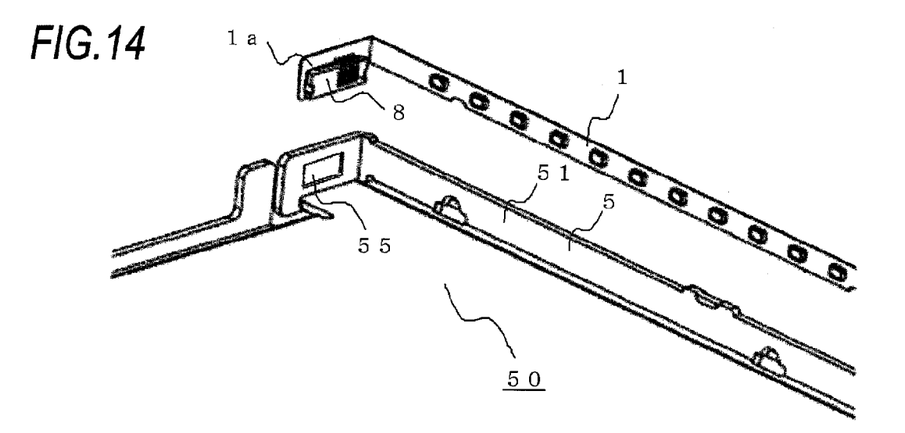
FIG. 14 is an enlarged view illustrating a part of the planar light source device according to the second illustrative embodiment.
Figure 15:
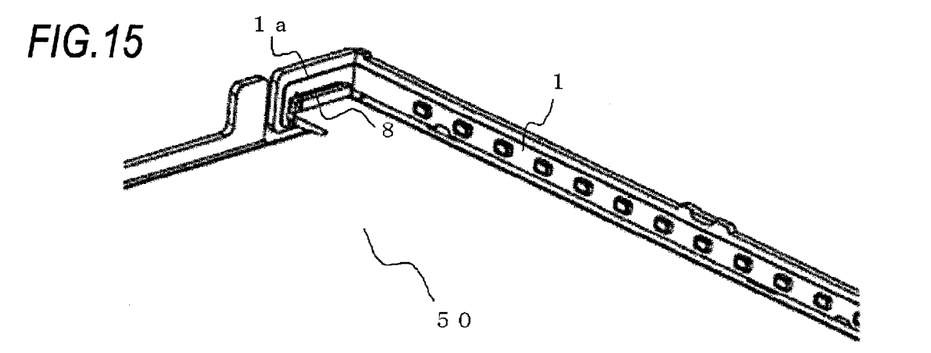
FIG. 15 is another enlarged view illustrating the part of the planar light source device according to the second illustrative embodiment.

FIGS. 10A to 10C are enlarged views of an FPC 1 for a planar light source device of a second illustrative embodiment. More specifically, FIG. 10A is a front view of the FPC 1, FIG. 10B is a side view of the FPC 1, and FIG. 10C is a rear view of the FPC 1. FIG. 11 is an enlarged view illustrating a part of the planar light source device of the second illustrative embodiment before the FPC 1 is disposed, FIG. 12 is an enlarged view illustrating the part of the planar light source device of the second illustrative embodiment after the FPC 1 is disposed, and FIG. 13 is a cross-sectional view illustrating the planar light source device of FIG. 12 taken along a line D-D. Further, FIGS. 14 and 15 are enlarged views illustrating a part of the planar light source device 50 where the FPC 1 having a plate-shaped member 9 is disposed at the side portion of the lower frame 5. More specifically, FIG. 14 shows a state before the FPC 1 is disposed, and FIG. 15 shows a state after the FPC 1 is disposed at the lower frame 5.

The planar light source device 50 of the first illustrative embodiment has the configuration in which the protruding portion 10 configured by the first protruding portion 1b and the second protruding portion 1c is provided from the end portion of the connector fixing portion 1a of the FPC 1 to wound around the inner portions 51, the connecting portion 54, and the outer portion 53 of the lower frame 5 so as to surround the side portion of the lower frame 5, and then is fixed to the side portion of the lower frame 5. However, in the second illustrative embodiment, as shown in FIGS. 10A to 13, the plate-shaped member 9 is provided on a reverse face 12, which is opposite to a right face 11 of the connector fixing portion 1a of the FPC 1. Also, at the lower frame 5 facing the plate-shaped member 9, a recess 55 having a shape corresponding to the plate-shaped member 9 is provided, and the plate-shaped member 9 is fit into the recess 55. The other configuration is the similar as that of the first illustrative embodiment, and thus only a different effect of the planar light source device according to the second illustrative embodiment will be described below.

As shown in FIGS. 10A to 10C, the FPC 1 for the planar light source device of the second illustrative embodiment includes the connector 8 fixed to the right face 11 of the fixing portion 1a, and the plate-shaped member 9 provided on the reverse face 12 which is the opposite face of the right face 11. The plate-shaped member 9 is attached in corresponding to the position where the connector 8 is disposed. The plate-shaped member 9 is adhered and fixed to the reverse face 12 of the fixing portion 1a of the FPC 1 by using an adhesive 15, which has an adhesive strength stronger than that of a double-stick tape 13 for attaching the FPC 1 to the lower frame 5.

The plate-shaped member 9 is a plate-shaped member having a thickness of 0.5 mm to 0.8 mm, and the plate-shaped member 9 is formed in a rectangular shape, for example. Also, the plate-shaped member 9 is made of a material including resins or metals.

Further, as shown in FIGS. 11 to 13, at the position of the lower frame 5 where the connector fixing portion 1a of the FPC 1 is disposed, the recess 55 having a shape correspond to the plate-shaped member 9 is formed. The recess 55 is formed in a rectangular shape to correspond to the plate-shaped member 9 formed in the rectangular shape and has a size larger than that of the plate-shaped member 9.

When the FPC 1 is disposed at the lower frame 5, the FPC 1 is fixed to the inner portions 51 of the lower frame 5 by the double-stick tape 13. The plate-shaped member 9 attached corresponding to the position of connector 8 is attached to fit into the recess 55.

As shown in FIGS. 14 and 15, similarly to the first illustrative embodiment, the FPC 1 is disposed along the inner portions 51 of the lower frame 5 so that the point light sources 7 of the mounting portion if face the incident face 2a of the light guide plate 2 shown in FIG. 2. Further, the connector fixing portion 1a is disposed at the inner portion 51 of the lower frame 5, and the plate-shaped member 9 is accommodated in the recess 55. FIGS. 14 and 15 show an example in which the FPC 1 is bent so that the mounting portion 1f and the connector fixing portion 1a are provided over the adjacent inner portions 51 of the lower frame 5. However, the FPC 1 may be provided along one inner portion 51 without being bent. The FPC 1 may be provided at the bottom of the lower frame 5.

Next, the effect of the second illustrative embodiment will be described with reference to FIG. 13. In case that the connector 81 of another electronic component is pulled out in the connection state, in which the connector 81 connects with the connector 8 fixed to the FPC 1, the connector 8 receives a strong force B in the pulling direction of the connector 81 (the opposite direction to the insertion direction of the connector 81), and the force is transmitted from the connector 8 to the fixing portion 1a of the FPC 1. In this case, a shearing stress is applied to the adhesive faces of the double-stick tape 13 having the FPC 1 and the lower frame 5 fixed thereon, and a force is applied to move the plate-shaped member 9 in the direction of the force B. On the other hand, since a side face 9a of the plate-shaped member 9 is disposed to face a side face 55a of the recess 55 of the lower frame 5 in the vicinity of the insertion hole 8a of the connector 8, the side face 9a of the plate-shaped member 9 abuts on the side face 55a of the recess 55. The adhesive 15 fixing the plate-shaped member 9 to the FPC 1 is stronger than the double-stick tape 13, so that the movement of the FPC 1 is restricted by the abutting of the side face 9a of the plate-shaped member 9 and the side face 55a of the recess 55. Therefore, it is possible to suppress a shift of the FPC 1 with respect to the lower frame 5 and a shift of the connector 8.

In case that the force C is applied in the insertion direction of the connector 81 as another electronic component, the side face 9a of the plate-shaped member 9 abuts on the side face 55a of the recess 55 of the lower frame 5 positioned far from the insertion hole 8a of the connector 8 so that the movement of the plate-shaped member 9 is suppressed. Therefore, it is possible to achieve the same effects.

As described above, according to the planar light source device of the second illustrative embodiment, the plate-shaped member 9 provided on the reverse face 12 of the connector fixing portion 1a of the FPC 1 is fit into the recess 55 of the lower frame 5 corresponding to the plate-shaped member 9. Therefore, it is possible to suppress a shift of the FPC 1 and the movement of the connector 8 due to an external force applied to the connector 8.

Further, at the lower frame 5, the recess 55 is formed at a position corresponding to the plate-shaped member 9. However, holes (not shown) may be formed. In case that holes are provided at the lower frame 5, since the holes can be formed from any one of the inner and outer faces, the manufacturing is easier as compared to the case of forming the recess 55.

Third Illustrative Embodiment

Figure 16A:
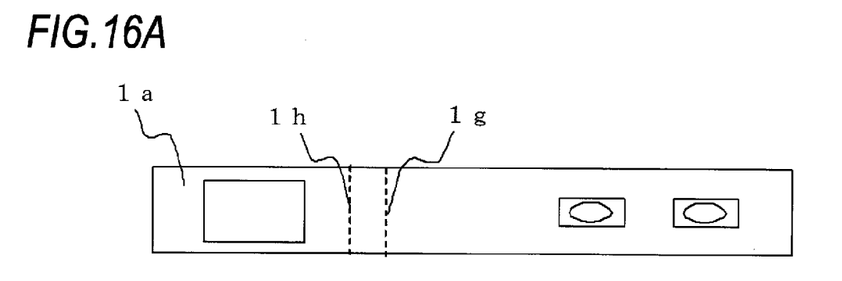
FIGS. 16A and 16B are enlarged views illustrating a part of an FPC for a planar light source device according to a third illustrative embodiment.
Figure 16B:
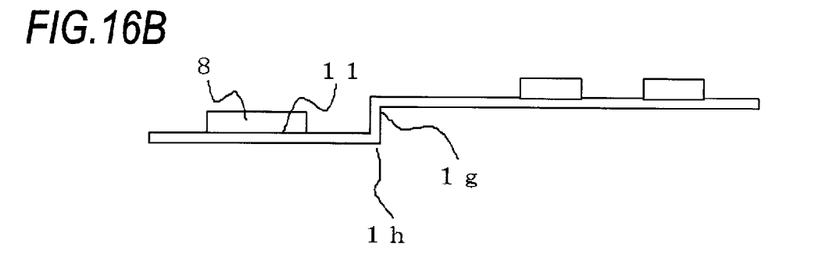
Figure 17:
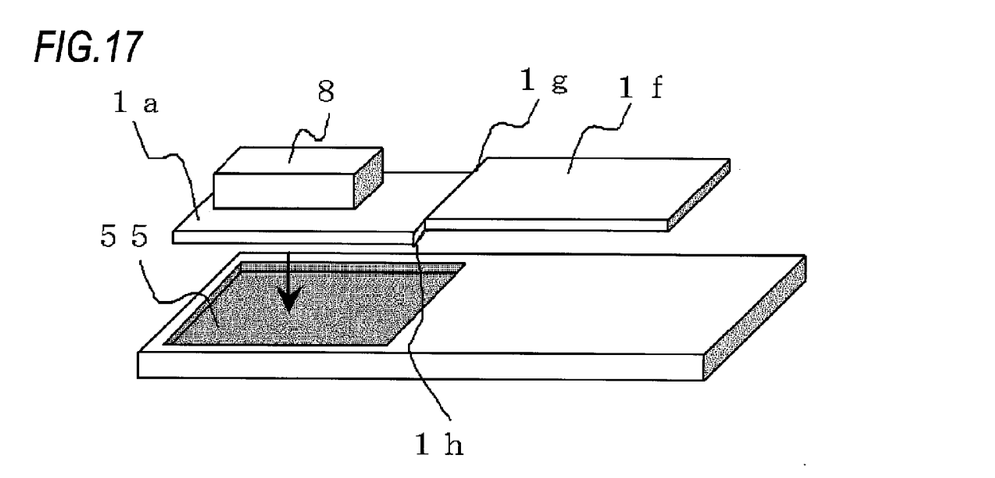
FIG. 17 is an enlarged view illustrating a part of a planar light source device according to the third illustrative embodiment.
Figure 18:
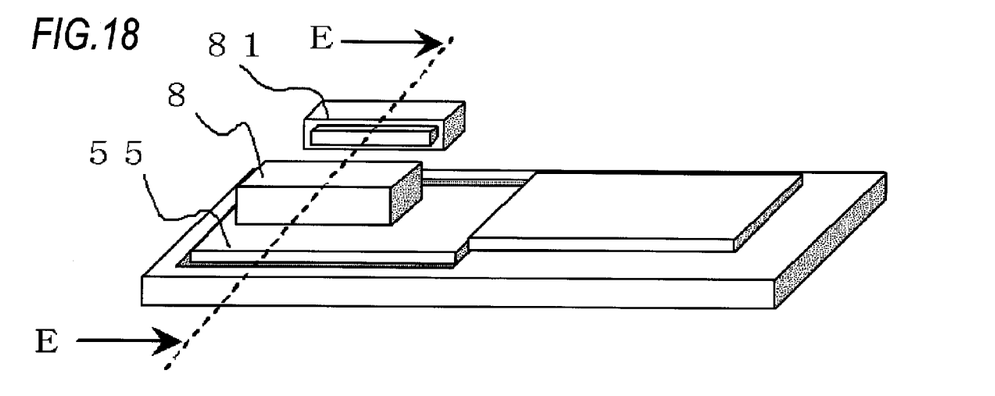
FIG. 18 is another enlarged view illustrating the part of the planar light source device according to the third illustrative embodiment.
Figure 19:
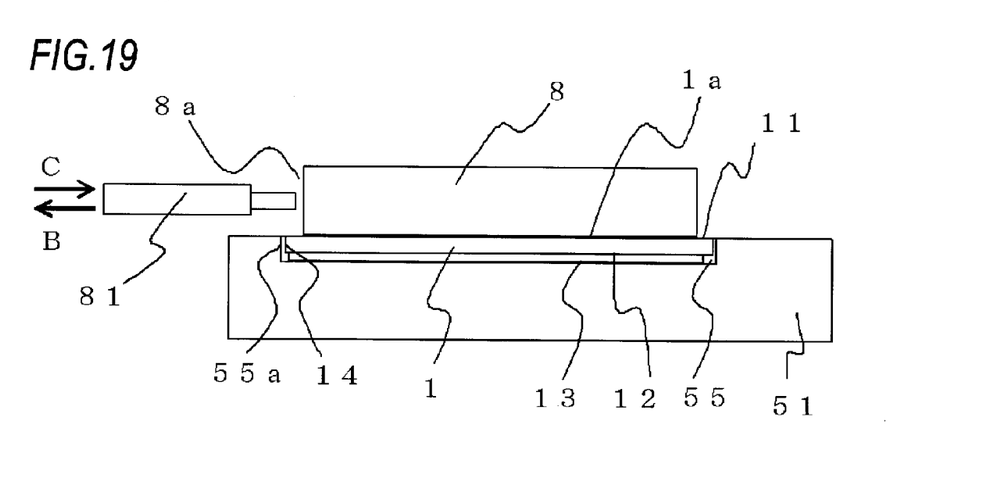
FIG. 19 is a cross-sectional view illustrating the planar light source device of FIG. 18 taken along a line E-E.

FIGS. 16A and 16B are enlarged views illustrating a part of an FPC 1 of a third illustrative embodiment, FIG. 17 is an enlarged view illustrating a part of a planar light source device of the third illustrative embodiment before the FPC 1 is disposed, FIG. 18 is an enlarged view illustrating the part of the planar light source device of the third illustrative embodiment after the FPC is disposed, and FIG. 19 is a cross-sectional view illustrating the planar light source device of FIG. 18 taken along a line E-E. In the second illustrative embodiment, the plate-shaped member 9 is provided on the reverse face 12, which is the opposite face of the right face 11 of the connector fixing portion 1a of the FPC 1, and the recess 55 is provided in a shape corresponding to the plate-shaped member 9 so that the FPC 1 is disposed. However, in the third illustrative embodiment, as shown in FIGS. 16A to 19, bent portions 1g and 1h are provided between the connector fixing portion 1a of the FPC 1 and the mounting portion 1f having the point light sources 7 disposed thereon. The FPC 1 has a step, and the connector fixing portion 1a is arranged in the recess 55 of the lower frame 5. Different components and effects of the planar light source device according to the third illustrative embodiment from the first or second illustrative embodiment will be described below.

As shown in FIGS. 16A and 16B, the FPC 1 to be disposed in the planar light source device of the third illustrative embodiment has the step between the connector fixing portion 1a and the mounting portion if of the FPC 1 by the bent portions 1g and 1h. Further, as shown in FIGS. 17 and 18, the fixing portion 1a for the connector 8 having the step is arranged in the recess 55 of the lower frame 5. As shown in FIG. 19, the reverse face 12 of the fixing portion 1a of the FPC 1 with the step is attached in the recess 55 by the double-stick tape 13. Further, a side face 14 of the FPC 1 is disposed to face the side face 55a of the recess 55.

As shown in FIG. 19, since the connector fixing portion 1a of the FPC 1 with the step is attached in the recess 55 of the lower frame 5, even if the connector 81 of another electronic component is inserted into or pulled out from the connector 8 and then the external force B or C is applied, the movement of the FPC 1 is restricted by the face adhesion using the double-stick tape 13. Also, even if an external force is applied to the double-stick tape 13, since the side face 14 of the FPC 1 is disposed to face the side face 55a of the recess 55 so that the side face 14 of the fixing portion 1a of the FPC 1 abuts on the recess 55, it is possible to suppress a shift of the FPC 1 with respect to the lower frame 5 and a shift of the connector 8.

Further, since the FPC 1 with the step is arranged in the recess 55 and is attached to the recess 55 by the double-stick tape 13, it is possible to suppress an increase in the thickness of the lower frame 5.

Fourth Illustrative Embodiment

Figure 20:
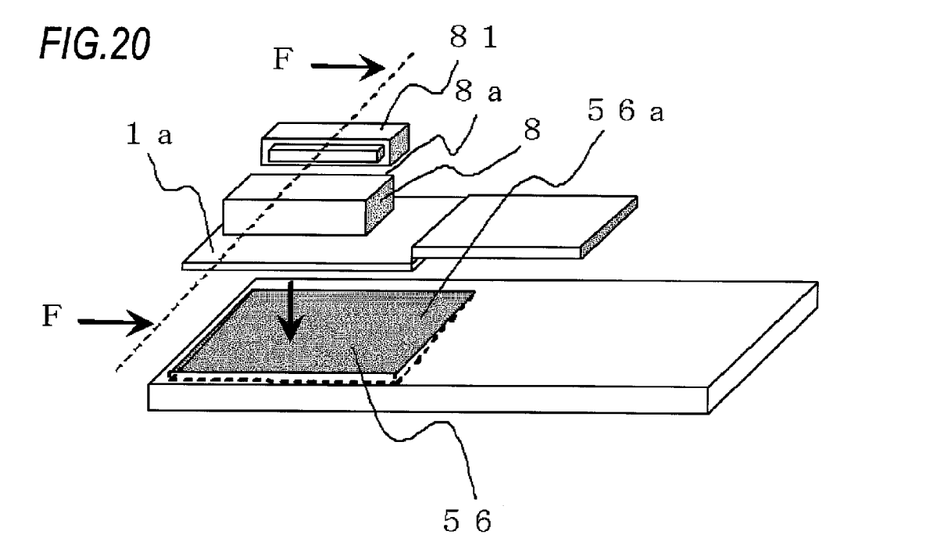
FIG. 20 is an enlarged view illustrating a part of a planar light source device according to a fourth illustrative embodiment.
Figure 21:
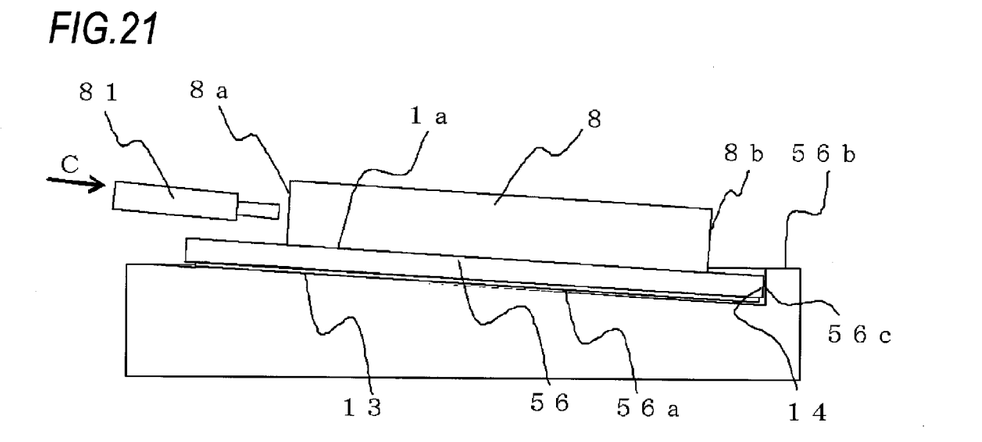
FIG. 21 is a cross-sectional view illustrating the planar light source device of FIG. 20 taken along a line F-F.

FIG. 20 is an enlarged view illustrating a part of a planar light source device according to a fourth illustrative embodiment, and FIG. 21 is a cross-sectional view illustrating the planar light source device of FIG. 20 taken along a line F-F. In the third illustrative embodiment, the bent portions 1g and 1h are provided between the connector fixing portion 1a of the FPC 1 and the mounting portion 1f having the point light sources 7 disposed thereon, and the connector fixing portion 1a is arranged in the recess 55 of the lower frame 5. However, in the fourth illustrative embodiment, as shown in FIGS. 20 and 21, a recess 56 provided at the lower frame 5 has a bottom 56a having an inclination with respect to an upper portion 56b, and the connector 8 is obliquely disposed. Different components and effects of the planar light source device according to the fourth illustrative embodiment from the above-mentioned first to third illustrative embodiments will be described below.

Similarly to the FPC 1 used in the third illustrative embodiment, the FPC 1 to be disposed in the planar light source device of the fourth illustrative embodiment has a step between the connector fixing portion 1a of the FPC 1 and the mounting portion 1f by the bent portions 1g and 1h as shown in FIG. 20. Further, as shown in FIGS. 20 and 21, the connector fixing portion 1a with the step is arranged in the recess 56 of the lower frame 5 having the bottom 56a with the inclination. The recess 56 is inclined with respect to the upper portion 56b, and the face 8b of the connector 8, which is disposed to opposite to the insertion hole 8a, is disposed on the bottom 56a with an inclined face. In FIG. 21, the insertion hole 8a of the connector 8 is disposed at a position higher than the opposite face 8b of the insertion hole 8a of the connector. Further, as shown in FIGS. 20 and 21, the reverse face 12 of the fixing portion 1a of the FPC 1 with the step is attached in the recess 56 by the double-stick tape 13. The side face 14 of the FPC 1 is disposed to face a side face 56a of the recess 56.

As shown in FIG. 21, since the connector fixing portion 1a of the FPC 1 with the step is attached in the recess 56 of the lower frame 5 having the inclination, even if the connector 81 of another electronic component is inserted into or pulled out from the connector 8 and then the external force C is applied, the movement of the FPC 1 is restricted by the face adhesion using the double-stick tape 13. If the external force C is applied to the double-stick tape 13, since the side face 14 of the FPC 1 is disposed to face the side face 56a of the recess 56 and the side face 56a of the recess 56 abuts on the side face 14 of the FPC 1, the movement of the FPC 1 is restricted. Therefore, it is possible to suppress a shift of the FPC 1 with respect to the lower frame 5 and a shift of the connector 8.

Fifth Illustrative Embodiment

Figure 22:
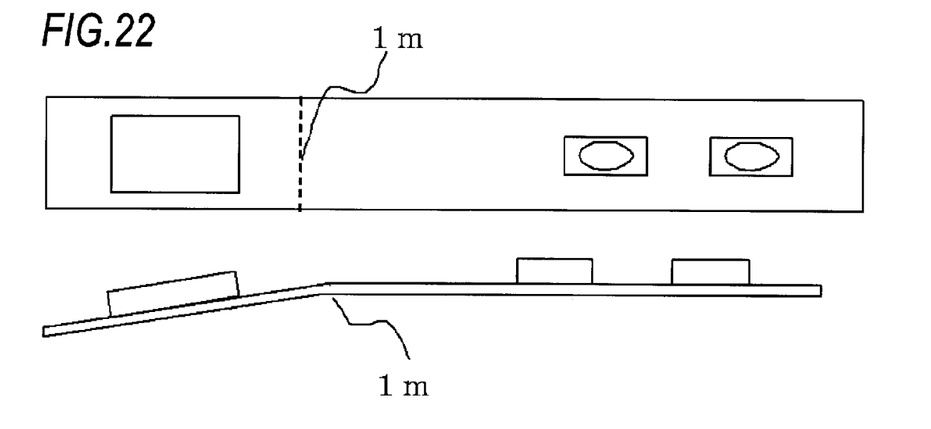
FIG. 22 is an enlarged view illustrating a part of a planar light source device according to a fifth illustrative embodiment.
Figure 23:
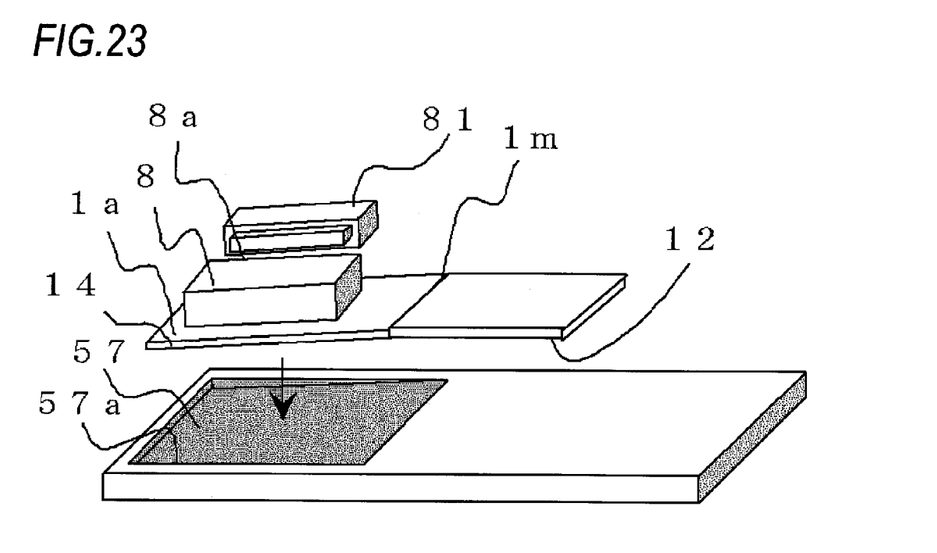
FIG. 23 is an enlarged view illustrating another part of the planar light source device according to the fifth illustrative embodiment.

FIG. 22 is an enlarged view illustrating a part of an FPC 1 according to a fifth illustrative embodiment, and FIG. 23 is an enlarged view illustrating a part of a planar light source device. In the fourth illustrative embodiment, the recess 56 of the lower frame 5 has the bottom 56*a* with the inclination with respect to the upper portion 56*b*, and accommodates the FPC 1 with the step. In the fifth illustrative embodiment, the FPC 1 is bent along a bent portion 1*m* so that the fixing portion 1*a* is inclined, and a bottom face of a recess 57 corresponding to the fixing portion 1*a* of the FPC 1 has an inclined face. Different components and effects of the planar light source device according to the fifth illustrative embodiment from the above-mentioned first to fourth illustrative embodiments will be described below.

As shown in FIGS. 22 and 23, the FPC 1 to be disposed in the planar light source device of the fifth illustrative embodiment is bent along the bent portion 1*m*, instead of the step portions provided in the third and fourth illustrative embodiments. Therefore, the connector fixing portion 1*a* is inclined with respect to the mounting portion 1*f* of the point light sources 7. Further, the fixing portion 1*a* is accommodated in the recess 57 of the lower frame 5 with the inclination. The reverse face 12 of the fixing portion 1*a* is attached by the double-stick tape. According to this configuration, even if an external force is applied when the connector 81 of another electronic component is inserted into or pulled out from the connector 8, the movement of the FPC 1 is restricted by the face adhesion using the double-stick tape. Further, since a side face 57*a* of the recess 57 abuts on the side face 14 of the connector fixing portion 1*a* of the FPC 1, it is possible to suppress a shift of the FPC 1 with respect to the lower frame 5 and a shift of the connector 8.

Also, since the FPC 1 is inclined along the bent portion 1*m*, the manufacturing is easier as compared to the third and fourth illustrative embodiments in which the step portions are formed.

This disclosure is not limited to the above-mentioned illustrative embodiments, but the illustrative embodiments can be appropriately modified or combined within the scope of this disclosure. For example, the FPC 1 may be fixed to the lower frame 5 by not only the double-stick tape but also engaging and the like.

What is claimed is:

1. A planar light source device comprising:
   a point light source that emits light;
   a circuit board that has a mounting portion, on which the point light source mounted, and
   a fixing portion, on which a connector supplying electric power to the point light source is mounted; and
   a frame that holds the circuit board with the point light source, wherein the circuit board has a protruding portion that protrudes from an end portion of the fixing portion, and
   wherein the fixing portion of the circuit board is fixed at an inner portion of the frame,
   wherein the protruding portion of the circuit board is fixed at an outer portion of the frame, and
   wherein a face of the fixing portion and a face of the protruding portion face each other and the frame is interposed therebetween, and
   wherein the connector has an insertion hole having a hole depth extending in a direction parallel to the face of the fixing portion wherein the hole is at one side of the connector and the end portion of the fixing portion is on an opposite side of the fixing portion from the side of the fixing portion that is adjacent to the insertion hole of the connector.

2. The planar light source device according to claim 1, wherein the circuit board includes another protruding portion that protrudes from the one
side close to the insertion hole of the connector.

3. The planar light source device according to claim 1, further comprising:
   an intermediate frame that is fitted into the frame,
   wherein the intermediate frame includes a protrusion that faces with a face of the connector, which is disposed opposite to the insertion hole.

4. A display device comprising:
   the planar light source device according to claim 1; and
   a display element that is disposed on the planar light source device and displays images.

5. The display device according to claim 4, wherein the display element does not interpose the face of the fixing portion and the face of the protruding portion.

6. The planar light source device according to claim 1, wherein the mounting portion does not interpose the face of the fixing portion and the face of the protruding portion.

7. The planar light source device according to claim 1, wherein a surface of the face of the fixing portion and a surface of the face of the protruding portion directly contact opposite surfaces the frame.

* * * * *